(12) United States Patent
Koyama

(10) Patent No.: US 7,061,530 B2
(45) Date of Patent: Jun. 13, 2006

(54) SEMICONDUCTOR INTEGRATED CIRCUIT

(75) Inventor: Eiji Koyama, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 637 days.

(21) Appl. No.: 09/883,990

(22) Filed: Jun. 20, 2001

(65) Prior Publication Data
US 2002/0047632 A1    Apr. 25, 2002

(30) Foreign Application Priority Data
Jun. 20, 2000    (JP)    ............... 2000-184736

(51) Int. Cl.
*H04N 5/217*    (2006.01)
*H04N 3/14*    (2006.01)
*H04N 5/335*    (2006.01)
*H03K 19/96*    (2006.01)
*H03K 9/08*    (2006.01)
*G01R 29/02*    (2006.01)

(52) U.S. Cl. .................. 348/241; 348/312; 326/96; 327/37

(58) Field of Classification Search ................ 348/241, 348/312, 208.16, 211.9, 222.1, 296, 304; 326/96; 327/3, 5, 7, 10, 37, 40, 58, 60, 62, 327/74; 315/291
See application file for complete search history.

(56) References Cited

U.S. PATENT DOCUMENTS

| | | | | |
|---|---|---|---|---|
| 4,268,793 A | * | 5/1981 | Amazawa et al. | ........... 327/384 |
| 5,838,372 A | * | 11/1998 | Wood | ........................ 348/312 |
| 5,883,830 A | * | 3/1999 | Hirt et al. | ............... 365/185.03 |
| 6,160,578 A | * | 12/2000 | Carroll et al. | ........... 348/222.1 |
| 6,448,825 B1 | * | 9/2002 | Le Cornec et al. | ......... 327/141 |
| 6,522,359 B1 | * | 2/2003 | Yamashita | .................. 348/312 |
| 2001/0047127 A1 | * | 11/2001 | New et al. | ................... 600/300 |
| 2005/0219086 A1 | * | 10/2005 | Piasecki et al. | ............. 341/110 |

FOREIGN PATENT DOCUMENTS

| | | | |
|---|---|---|---|
| JP | 03075976 A | * | 3/1991 |
| JP | A6283999 | | 10/1994 |
| JP | 08265153 A | * | 10/1996 |
| JP | 2000196451 A | * | 7/2000 |

OTHER PUBLICATIONS

Official Translation of Japanese Publ. No. 06-283999.*

* cited by examiner

*Primary Examiner*—Ngoc-Yen Vu
*Assistant Examiner*—John M. Villecco
(74) *Attorney, Agent, or Firm*—Birch, Stewart, Kolasch & Birch, LLP

(57) ABSTRACT

Even when variation in transistor characteristic, resistance or the like occurs during manufacturing, a noise component is always minimized. Each of k clock phase difference generating circuits 16–18 shifts a phase of a basic clock signal ADCK1 by a specified different value to obtain a clock signal ADCK2 and supplies the clock signal ADCK2 to an A/D converter. A k counter 19 successively selects the clock phase difference generating circuits 16–18 and stores a noise component in an output of the A/D converter measured by a noise measuring circuit 27 in a corresponding register. A comparator 25 compares k noise components and obtains the number j of the clock phase difference generating circuit giving a minimum value. A selection circuit 26 fixedly selects only the j-th clock phase difference generating circuit. Thus, even when variation in the transistor characteristics or resistance occurs in each device in a manufacturing stage, the clock signal ADCK2 obtained by shifting the phase of the basic clock signal ADCK1 can be supplied to the A/D converter so that a noise component is minimized for each device.

2 Claims, 6 Drawing Sheets

SEMICONDUCTOR INTEGRATED CIRCUIT

BACKGROUND OF THE INVENTION

The present invention relates to a digital/analog mixed type semiconductor integrated circuit wherein a digital circuit and analog circuit are formed on the same semiconductor substrate. In particular, the present invention relates to a digital/analog mixed type semiconductor integrated circuit such as a CMOS (complementary metal oxide semiconductor)-type solid-state image sensing device or the like which incorporates a digital signal processing circuit and an A/D (Analog/Digital) converter and handles weak analog signals.

With a more highly integrated semiconductor circuit, the system-on-chip method, in which one system is formed on the same substrate, is being used more widely. A digital/analog mixed type semiconductor integrated circuit is also being used wherein a digital circuit and an analog circuit often provided on separate chips conventionally are formed on the same substrate.

In such a digital/analog mixed type semiconductor integrated circuit, there is a problem that digital noises generated upon an operation of the digital circuit adversely affect an operation of the analog circuit via a power source, ground, substrate or the like.

This occurs primarily for the following reasons. That is, CMOS circuits are generally used for a digital circuit for higher integration and lower power consumption. In this CMOS circuit, a charge or discharge current charging or discharging a load capacitance when an output is inversed or a through-current flowing from a power source to a ground within an element flows only for a very short period. Therefore, a large power source current flows within the digital circuit immediately after a clock level changes, and thereafter almost no current flows until the clock level changes.

Due to such an abrupt change of the power source current, the power source voltage changes or the capacitance of a junction formed between a diffusion layer of a transistor and a semiconductor substrate is charged or discharged depending on the transistor operation. Then, this change adversely affects an operation of the analog circuit via the semiconductor substrate and produces noises.

FIG. 6 is a block diagram of a conventional A/D converter incorporated CMOS-type solid-state image sensing device which is typical as a digital/analog mixed type semiconductor integrated circuit. In the figure, a timing generator 1 generates various sensor drive pulses for driving a sensor 2 and generates a basic clock ADCK for driving an A/D converter 3 at the same time. In a case of such an integrated circuit, as described above, a noise component generated by an operation of the A/D converter 3 is often mixed in a weak analog signal component of the sensor 2.

As a countermeasure against this case, besides methods of improving a design of a wiring pattern, pin layout or the like, for example, there is a method of relatively shifting a clock signal phase for operating the analog circuit and that of the digital circuit. When the clock phases are to be shifted, however, it is very difficult to predict an optimum clock phase difference before designing since a shift amount of the clock phases is changed in practice by a wiring resistance, stray capacitance or the like within a device.

Accordingly, to solve such problems, such a semiconductor integrated circuit device as disclosed in Japanese Patent Laid-Open Publication No. 6-283999 has been proposed. In this semiconductor integrated circuit device, clock phase difference generating circuits generating several kinds of clock phase differences are prepared in advance. Then, in an experimental stage, a sine-wave generator and a spectrum analyzer are connected thereto and a clock phase difference generating circuit for generating a clock phase difference which produces least noises in the analog circuit is selected. In a mass production stage, the sine-wave generator and the spectrum analyzer are removed and only one mask is changed out of the mask configuration in the experimental stage. Thus, a wiring pattern is fixed so that only the above selected clock phase difference generating circuit is activated.

In the conventional semiconductor integrated circuit device, however, there are problems described below. That is, once a clock phase difference generating circuit is selected, the wiring pattern is fixed so that only this clock phase difference generating circuit is activated in the manufacturing stage. Therefore, the clock phase difference is not changed thereafter. However, in a process of manufacturing an integrated circuit, it is natural that variation in transistor characteristics, resistance or the like occurs during manufacturing. Therefore, that clock phase difference generating circuits which are the same on design do not always generate a constant clock phase difference. Rather, the same clock phase difference is rarely generated in practice.

Therefore, in the above-described semiconductor integrated circuit device, a clock phase difference generating circuit producing the least noise components is not always selected.

SUMMARY OF THE INVENTION

Accordingly, an object of the present invention is to provide a semiconductor integrated circuit capable of adjusting clock phases to a digital circuit so that a noise component of a analog circuit is always minimized even when variation occurs in transistor characteristics, resistance or the like during manufacturing.

To achieve the above object, the present invention provides a semiconductor integrated circuit wherein an analog circuit operating in response to a first clock signal and a digital circuit operating in response to a second clock signal having the same period as that of the first clock signal are formed on the same semiconductor substrate; comprising on the semiconductor substrate:

a plurality of phase shift circuits each relatively shifting a phase of one of the first clock signal and the second clock signal from a phase of the other of the first clock signal and the second clock signal by a different value; and a noise measuring circuit for measuring a noise component generated by the analog circuit.

According to the above constitution, a phase shift circuit which minimizes the noise component can be selected by measuring a noise component generated in the analog circuit by a noise measuring circuit when each phase shift circuit is selected. Therefore, even when variation in transistor characteristics or resistance occurs in semiconductor integrated circuits in the manufacturing stage, the above selected phase shift circuit is fixedly selected so that a noise component generated by the analog circuit is minimized thereafter.

One embodiment comprises on the semiconductor substrate:

selection control means for successively replacing and selecting the plurality of phase shift circuits; and phase shift setting means for obtaining a minimum value out of the noise components measured when each of the phase shift circuits is selected and setting a phase shift value by fixedly selecting only a phase shift circuit selected when the noise component assumes the minimum value.

According to the above constitution, the phase shift circuit for minimizing a noise component generated by the analog circuit is obtained out of a plurality of phase shift circuits by operations of selection control means and phase shift setting means. Then, only the aforementioned phase shift circuit is fixedly selected and the subsequent phase shift value is set. Therefore, even when variation in transistor characteristics or resistance occurs in semiconductor integrated circuits in the manufacturing stage, the noise component generated by the analog circuit is minimized thereafter.

In one embodiment, the number of the plurality of phase shift circuits is k (k: positive integer); and the noise measuring circuit measures the noise component k times corresponding to the number k of the phase shift circuits.

According to the above constitution, the successive selection of a plurality of phase shift circuits and the read-out of measured values of a noise component can be synchronized. Therefore, the read-out of the measurement result by the noise measuring circuit can be controlled by the selection control means for performing successive selection of the phase shift circuits.

One embodiment comprises operation start control means for starting an operation of the selection control means when a first specified time elapses after having powered on.

According to the above constitution, when a first specified time for achieving a stable operation elapses after having powered on, the successive selection of a plurality of phase shift circuits is started by operation start control means. Therefore, a phase shift circuit minimizing a noise component generated by the analog circuit is stably selected.

One embodiment comprises time measuring means for measuring a second specified time after termination of successive selection of the phase shift circuits by the selection control means, and operating the selection control means when the second specified time elapses, wherein successive selection of the phase shift circuits is repeated at intervals of the second specified time.

According to the above constitution, a phase shift value minimizing the noise component is repeatedly set at intervals of the second specified time. Therefore, even when a variation in a phase shift value set when the first specified time elapses after having powered on occurs due to a temperature rise or a change in a power source voltage during the operation period, a noise component generated by the analog circuit is always minimized.

In one embodiment, the analog circuit is a solid-state image sensing element array; and the noise component measured by the noise measuring circuit is a noise component superimposed on a video signal of a shielded region outputted from the solid-state image sensing element array during one valid horizontal period; and successive selection of the phase shift circuits by the selection control means is performed in synchronization with a vertical period.

According to the above constitution, the selection control means is operated by a vertical synchronization signal, so that successive selection of phase shift circuits and measurement of a noise component superimposed on a video signal in the shielded region are performed. Then, a phase shift value is set by the phase shift setting means so that the noise component is minimized. Therefore, even when variation in transistor characteristics or resistance occurs in semiconductor integrated circuits in the manufacturing stage, a noise component superimposed on a video signal outputted from the solid-state image sensing element array is minimized thereafter.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
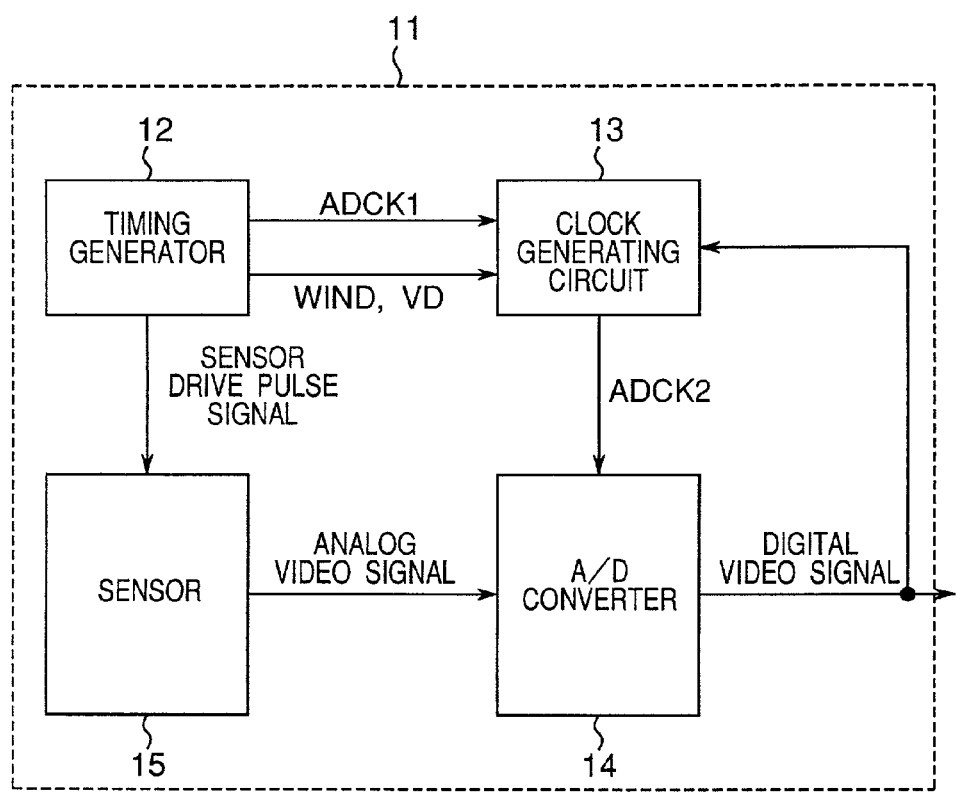
FIG. 1 is a block diagram of an A/D converter-incorporated CMOS-type solid-state image sensing device as a semiconductor integrated circuit of the present invention.

The present invention is described more specifically with reference to embodiments shown in the drawings.

(First Embodiment)

FIG. 1 is a block diagram of a semiconductor integrated circuit of this embodiment. This semiconductor integrated circuit 11 is an integrated circuit which is an A/D converter-incorporated CMOS-type solid-state image sensing device. This integrated circuit includes a clock generating circuit 13 generating a clock signal ADCK2 obtained by shifting a phase of a basic clock signal ADCK1 for driving the A/D converter 14 outputted from a timing generator 12 to a phase for minimizing a noise component included in an output signal of the A/D converter 14. An analog video signal from each solid-state image sensing element of a sensor 15 driven in response to a sensor drive pulse signal (having the same period as that of the basic clock signal ADCK1) from the timing generator 12 is A/D-converted by the A/D converter 14 to output a digital video signal.

That is, in this embodiment, the sensor drive pulse signal is an example of a first clock signal. The sensor 15 is an example of an analog circuit. The clock signal ADCK2 is an example of a second clock signal. The A/D converter 14 is an example of a digital circuit.

Figure 3:
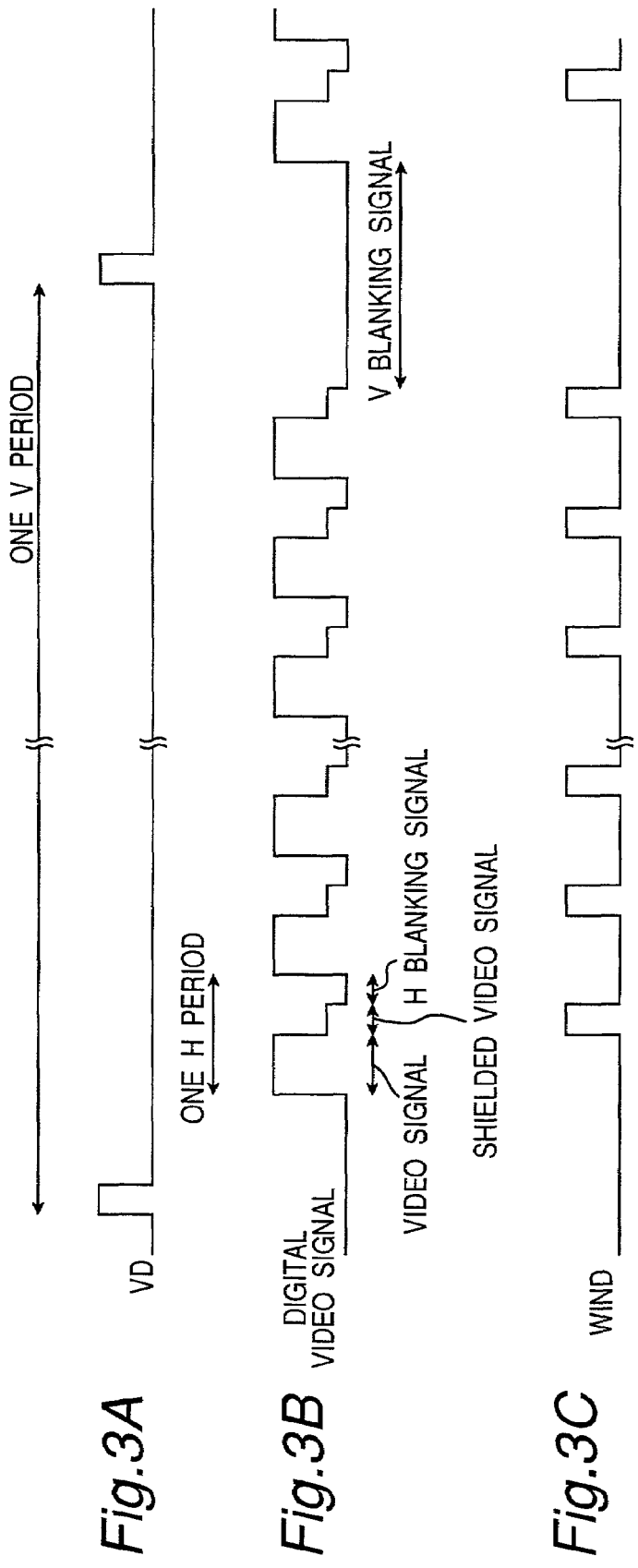
FIGS. 3A, 3B and 3C are timing charts of a digital video signal from an A/D converter in FIG. 1.

FIGS. 3A, 3B and 3C are timing charts of a digital video signal outputted from the A/D converter 14. FIG. 3A is a vertical synchronization pulse signal VD and a pulse signal representing one V (Vertical) period, which is one screen period. It is noted that an H period represents one horizontal period. FIG. 3B shows a digital video signal from the A/D converter 14. This digital video signal includes a video signal component and a blanking signal component. Out of these, a video signal component of a shielded region (hereinafter, abbreviated to shielded video signal component) is generally included in the video signal component. Therefore, it is appropriate when a noise component is evaluated that only this shielded video signal component is treated.

FIG. 3C shows a window pulse signal WIND. A window period is set to extract a shielded video signal component positioned at a termination of the H period in a normal video signal component. A shielded video signal component taken out by the window pulse signal WIND should be originally constant, but has various values since a noise component is superimposed in practice thereto.

Figure 2:
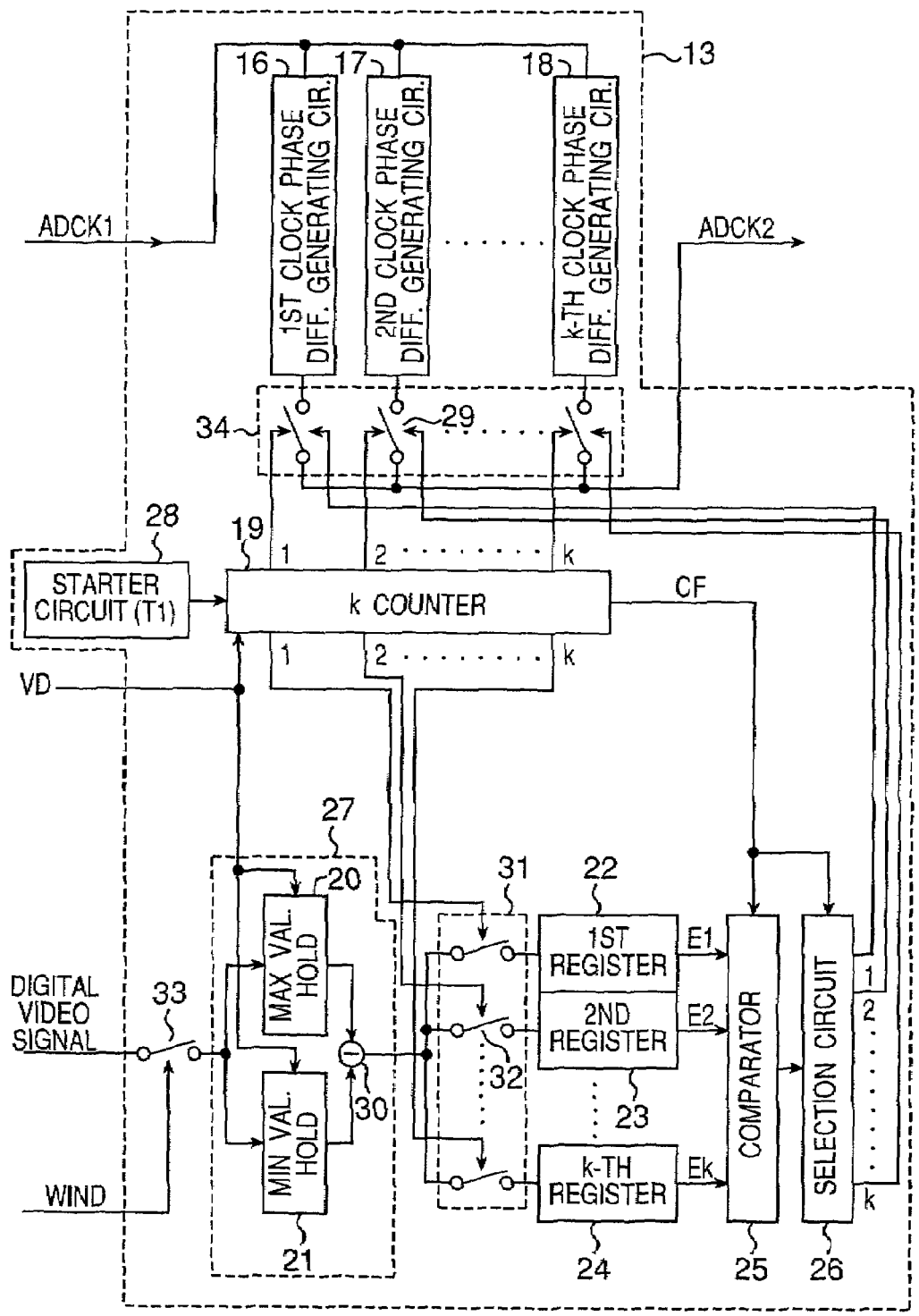
FIG. 2 is a specific block diagram of a clock generating circuit in FIG. 1.

FIG. 2 is a block diagram showing an example of a specific configuration of the clock generating circuit 13 in FIG. 1. This clock generating circuit 13 is generally constituted by a first to k-th clock phase difference generating circuits 16–18 connected between an input terminal of the basic clock signal ADCK1 and an output terminal of the clock signal ADCK2, k counter 19, maximum value holding circuit 20, minimum value holding circuit 21, first to k-th registers 22–24, comparator 25 and selection circuit 26. The maximum value holding circuit 20, minimum value holding circuit 21 and a subtracter 30 constitute a noise measuring circuit 27.

The clock generating circuit 13 having the above constitution operates as described below. First, when a power source is inputted and then a specified time T1 elapses, a starter circuit 28 starts operation of the k counter 19 for a stable operation. Usually, the specified time T1 is generally selected in a range from about several msec to several hundred msec although depending on the design content of an integrated circuit. The k counter 19 count up k (k: positive integer) vertical synchronization pulses VD and ends. At this time, for example, when a second vertical synchronization pulse VD is counted, a second switch 29 provided between the second clock phase difference generating circuit 17 and the output terminal of the clock signal ADCK2 is turned on to select the second clock phase difference generating circuit 17. At the same time, a second switch 32 in a switch group 31 provided between a subtracter 30 and registers 22–24 is turned on so that a difference value E2 from the subtracter 30 is written in a second register 23. In this case, a maximum value (content held in the maximum value holding circuit 20) and minimum value (content held in the minimum value holding circuit 21) of the shielded video signal component taken in by a switch 33, which is turned on only while the window pulse signal WIND level is "H", are inputted to the subtracter 30. Therefore, a difference value E between the maximum value and the minimum value of the shielded video signal component during one V period is written in the second register 23 as the noise component. Here, "k" is a total number of clock phase difference generating circuits 16–18. Various kinds of circuits are proposed in the aforementioned Japanese Patent Laid-Open Publication No. 6-283999.

Then, since the count value of k counter 19 is increased by the vertical synchronization pulse VD at the termination of the one V period, a third clock phase difference generating circuit is selected in the next one V period and the contents of the maximum value holding circuit 20 and the minimum value holding circuit 21 are reset at the same time. Then, only the shielded video signal component is taken in based on the window pulse signal WIND, a maximum value and minimum value thereof are held and a difference value E3 is written in a third register.

Then, this operation is repeated. At the termination of the k-th V period, operations of the comparator 25 and the selection circuit 26 are started by a count termination pulse CF from the k counter 19. Then, out of difference values E1 to Ek, a number j (=1, . . . , k) of a difference value Ej exhibiting the minimum value (noise component is minimum) is obtained by the comparator 25 and outputted to the selection circuit 26. Then, the selection circuit 26 operates so that only the j-th switch is turned on out of a group of k switches 34 provided between the first to k-th clock phase difference generating circuits 16–18 and the output terminal of the clock ADCK2 and that all the other switches are turned off. Thus, the j-th phase difference generating circuit is always selected Thus, even when variation in transistor characteristics or resistance occurs in A/D converter-incorporated CMOS-type solid-state image sensing devices during manufacturing, an optimum clock phase difference generating circuit minimizing a noise component of an analog video signal from the sensor 15, which is an analog circuit, can be selected for each device.

That is, in this embodiment, a selection control means is constituted by the k counter 19 and the switch group 34. A phase shift setting means is constituted by the comparator 25, selection circuit 26 and switch group 34. An operation start control means is constituted by the starter circuit 28.

As described above, in this embodiment, there is incorporated the clock generating circuit 13 shifting a phase of the basic clock signal ADCK1 for the A/D converter 14 from the timing generator 12 and generating the clock signal ADCK2.

The clock generating circuit 13 includes k clock phase difference generating circuits 16–18 each shifting a phase of the basic clock signal ADCK1 by a specified different value and supplying the signal to the A/D converter 14 as a clock signal ADCK2. Then, when a power is inputted, the k clock phase difference generating circuits 16–18 are successively selected by the k counter 19. A difference value (noise component ) E of a maximum value and a minimum value of a shielded video signal component in a digital video signal from the A/D converter 14 is obtained each time and then stored in the first to k-th registers 22–24. Then, k difference values E are compared by the comparator 25 to obtain j, the number for the minimum value. Thus, only the j-th clock phase difference generating circuit (that is, a clock phase difference generating circuit for minimizing a noise component included in an output signal from the A/D converter 14) is fixedly selected by the selection circuit 26.

Therefore, even when variation in transistor characteristics or resistance occurs in each A/D converter-incorporated CMOS-type solid-state image sensing device in the manufacturing stage, a phase of the clock signal ADCK2 obtained by shifting the basic clock signal ADCK1 so that a noise component of an output signal included in the sensor 15 is minimized can be supplied to the A/D converter 14 for each device.

(Second Embodiment)

The configuration of the clock generating circuit 13 in FIG. 1 is not limited to the one shown in FIG. 2. This embodiment relates to another circuit configuration of the clock generating circuit 13.

Figure 4:
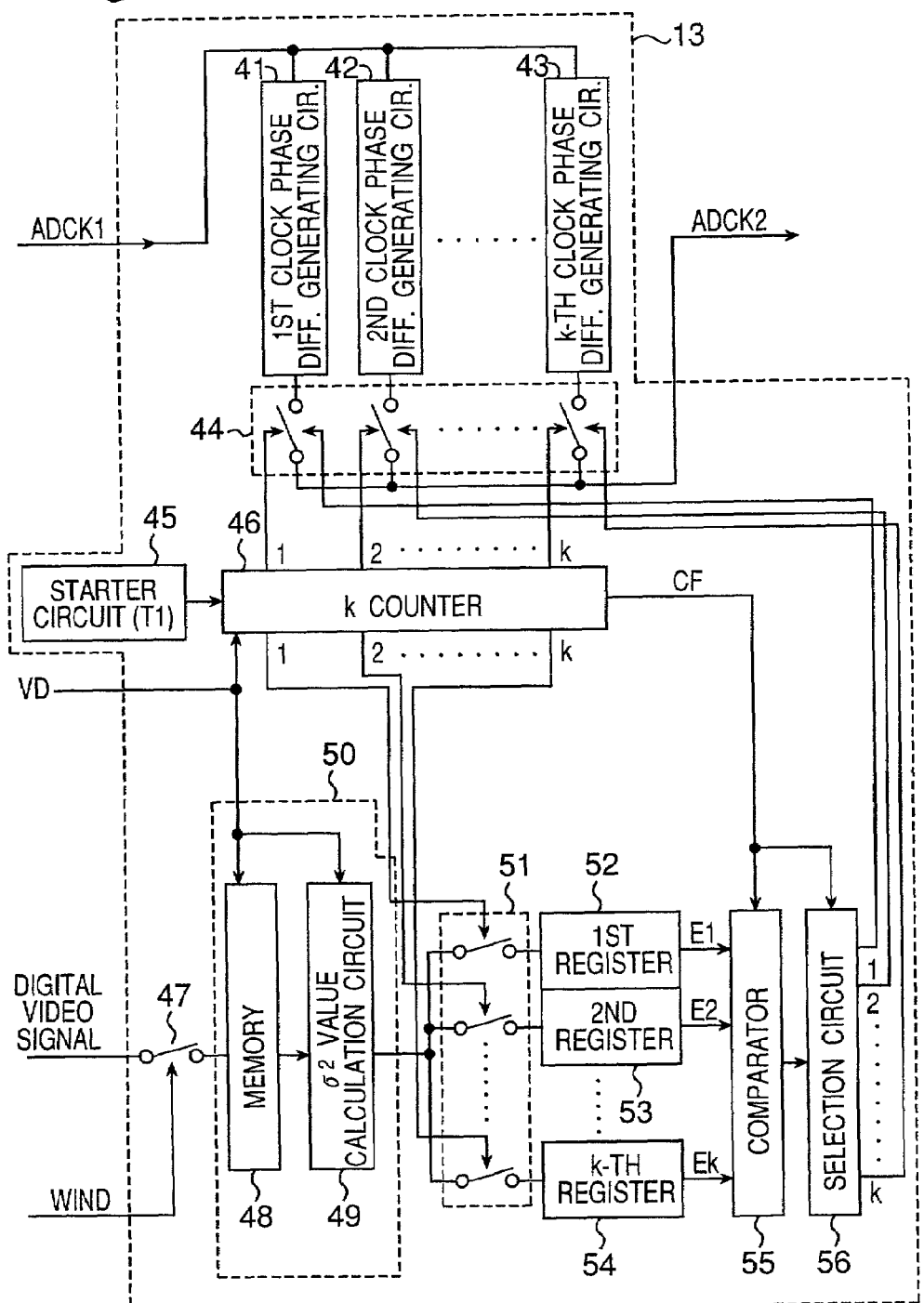
FIG. 4 is a block diagram of a clock generating circuit different from the one in FIG. 2.

FIG. 4 is a block diagram showing a configuration of the clock generating circuit 13 in FIG. 1 different from the first embodiment. In FIG. 4, a first to k-th clock phase difference generating circuits 41–43, switch group 44, starter circuit 45, k counter 46, switch 47, switch group 51, first to k-th registers 52–54, comparator 55 and selection circuit 56 have the same constitutions as those of the first to k-th clock phase difference generating circuits 16–18, switch group 34, starter circuit 28, k counter 19, switch 33, switch group 31, first to k-th registers 22–24, comparator 25 and selection circuit 26, respectively, in the above first embodiment shown in FIG. 2.

In this embodiment, measurement of a noise component included in a digital video signal from the A/D converter 14 shown in FIG. 1 is performed not by a difference between a maximum value and a minimum value of the shielded video signal component in a digital video signal, but by a variance $\sigma^2$ of all the shielded video signal components in one V period.

That is, in this embodiment, a noise measuring circuit 50 is constituted by a memory 48 and a $\sigma^2$ value calculation circuit 49. The memory 48 holds all the shielded video signal components for one V period captured by a switch 47, which is turned on only while the window pulse signal WIND level is "H". Also, the $\sigma^2$ value calculation circuit 49 calculates a variance $\sigma^2$ of the shielded video signal components for one V period by using a vertical synchronization signal VD as a trigger. Here, the variance $\sigma^2$ represents:

$$\sigma^2 = \text{(average of square value-square of average value)}.$$

The variance $\sigma^2$ thus calculated is written in a register selected by the k counter 46 out of the first to k-th registers 52–54. Thereafter, as in the case of the first embodiment, only a clock phase difference generating circuit generating the least noise components is fixedly selected out of the first to k-th clock phase difference generating circuits 41–43.

(Third Embodiment)

As described in the above second embodiment, various methods are considered as a method for measuring the noise component. However, a temperature may rise or a power source voltage may change in an operation period of the clock generating circuit 13. In such a case, transistor characteristics change even in the first or second embodiment. Therefore, there are cases where a clock phase difference generating circuit selected in an initial stage of the operation is not necessarily an optimum clock phase difference generating circuit.

This embodiment relates to a clock generating circuit which can deal with such a case. In a case of the clock generating circuit 13 in the first or second embodiment, the power source is inputted, the operation is stabilized, and then the optimum clock phase difference generating circuit is selected only in the k V periods in the initial stage. On the other hand, in a case of the clock generating circuit in this embodiment, the optimum phase difference generating circuit is selected in the k V periods in the initial stage, and then, further after a specified period (T2), the optimum phase difference generating circuit is again selected in k V periods.

Figure 5:
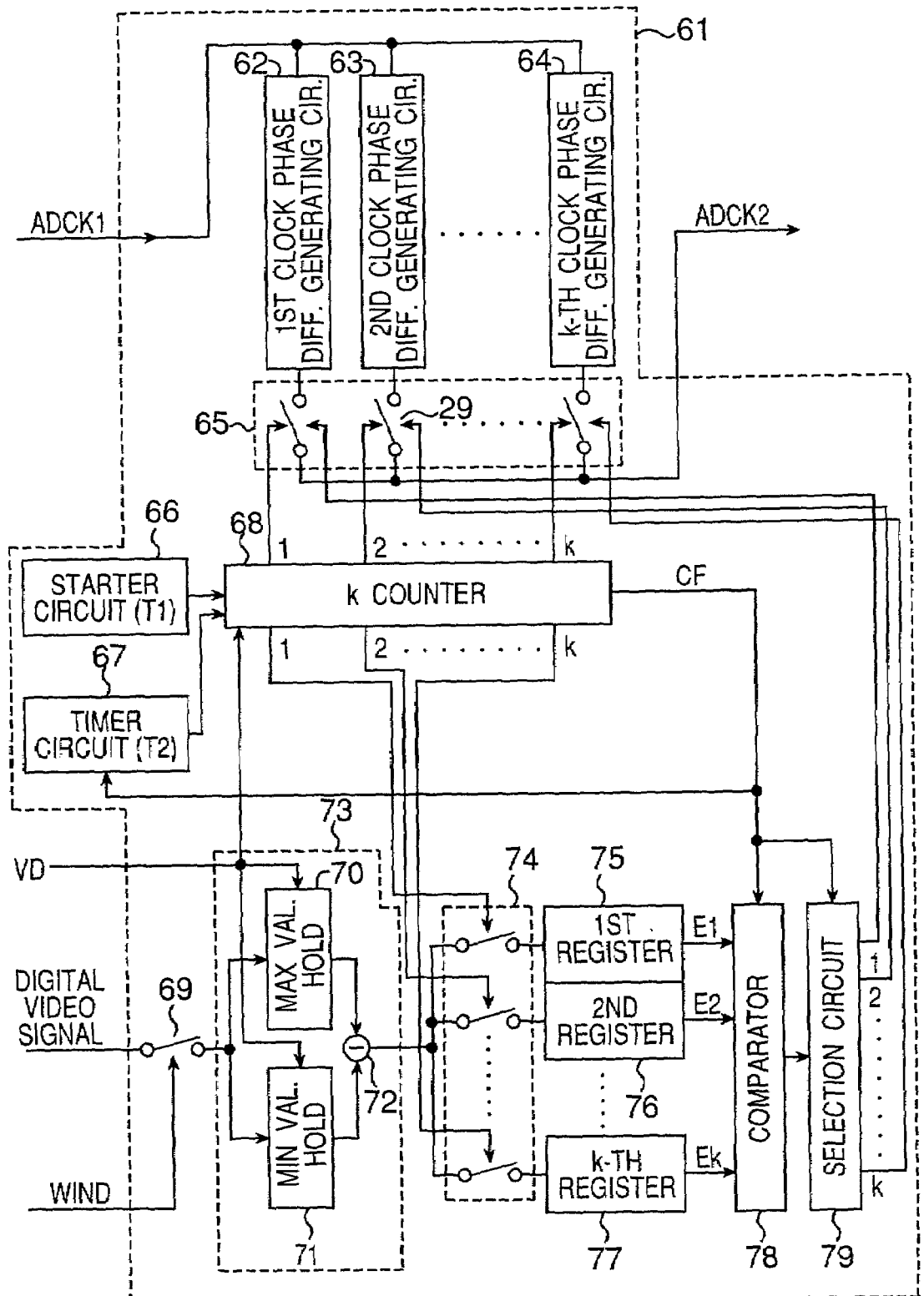
FIG. 5 is a block diagram of a clock generating circuit different from those in FIGS. 2 and 4.
Figure 6:
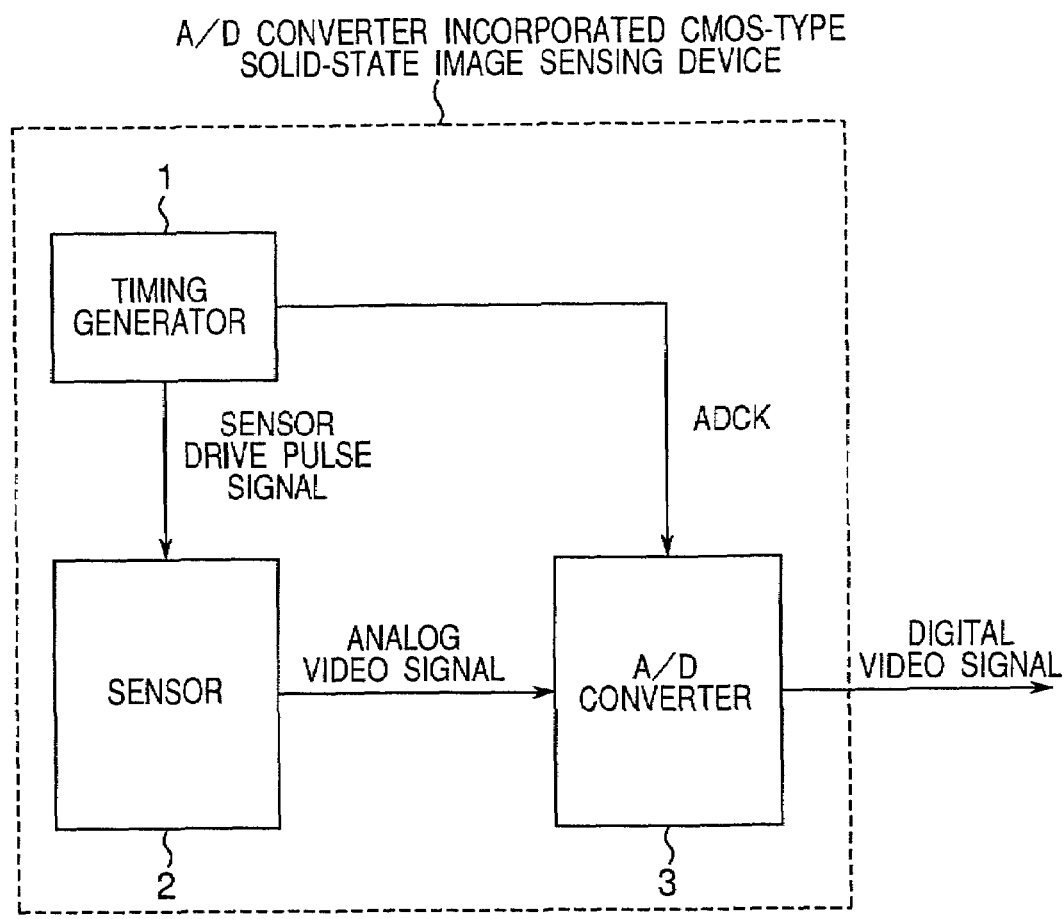
FIG. 6 is a block diagram of a conventional A/D converter-incorporated CMOS-type solid-state image sensing device.

FIG. 5 shows a circuit configuration of the clock generating circuit 61 in this embodiment. In FIG. 5, a first to k-th clock phase difference generating circuits 62–64, switch group 65, starter circuit 66, k counter 68, switch 69, maximum value holding circuit 70, minimum value holding circuit 71, subtracter 72, noise measuring circuit 73, switch group 74, first to k-th registers 75–77, comparator 78 and selection circuit 79 have the same constitutions as those of the first to k-th clock phase difference generating circuits 16–18, switch group 34, starter circuit 28, k counter 19, switch 33, maximum value holding circuit 20, minimum value holding circuit 21, subtracter 30, noise measuring circuit 27, switch group 31, first to k-th registers 22–24, comparator 25 and selection circuit 26 in the first embodiment shown in FIG. 2.

In this embodiment, a timer circuit 67 operating the k counter 68 when a specified period T2 elapses is provided as a time measuring means. At the termination of the k V periods, the timer circuit 67 is set by a count termination pulse CF outputted from the k counter 68. Then, after the specified period T2 elapses, the k counter 68 is operated again and the optimum phase difference generating circuit is selected again in the k V period. Thereafter, this operation is repeated and, each time the specified period T2 elapses, the optimum phase difference generating circuit is selected.

It is noted that usually the specified time T2 of the timer circuit 67 is sufficiently long as compared with the specified time T1 of the starter circuit 66. This is because a temperature rise or a change in a power source voltage never occurs instantaneously.

As described above, in this embodiment, the optimum phase difference generating circuit is selected in the k V periods in the initial stage, and then the optimum clock phase difference generating circuit is further selected by the timer circuit 67 each time the specified period T2 elapses. Therefore, even when a shift amount of the optimum phase of the basic clock signal ADCK1 from the sensor drive pulse signal is changed due to a temperature rise or a change in a power source voltage during the operation period of the A/D converter-incorporated CMOS-type solid-state image sensing device, a digital video signal producing a little noise component can be outputted.

In the above embodiments, the phase of the clock signal ADCK2 to the A/D converter 14 with respect to the phase of the sensor drive pulse signal to the sensor 15 is shifted. However, the phase of the sensor drive pulse signal with respect to the phase of the basic clock signal ADCK1 may also be shifted.

Also, in the above embodiments, the A/D converter-incorporated CMOS-type solid-state image sensing device was explained as an example, but it is needless to say that this invention is also applicable to a general digital/analog mixed type semiconductor integrated circuit.

As evident from the above, in the digital/analog mixed type semiconductor integrated circuit of the present invention, a plurality of phase shift circuits each shifting a phase of the first clock signal for the analog circuit or the second clock signal for the digital circuit by a relatively different value and a noise measuring circuit for measuring a noise component generated by the analog circuit are provided on the same semiconductor substrate with the analog circuit and the digital circuit. Therefore, a phase shift circuit minimizing the noise component can be selected by measuring the noise component generated when each phase shift circuit is successively selected.

Therefore, even when variation in transistor characteristics or resistance occurs in each semiconductor integrated circuit in the manufacturing stage, the noise component generated by the analog circuit can be minimized thereafter by fixedly selecting the selected phase shift circuit.

In one embodiment, the plurality of phase shift circuits are successively replaced and selected by the selection control means and only the phase shift circuit minimizing the noise component is fixedly selected by phase shift setting means to set a phase shift value. Therefore, even when variation in transistor characteristics or resistance occurs in semiconductor integrated circuits in the manufacturing stage, the noise component generated by the analog circuit can be minimized after setting of the phase shift value.

In one embodiment, when the number of the phase shift circuits is k (k: positive integer), the noise component is measured k times by the noise measuring circuit. Therefore, successive selection of the plurality of phase shift circuits and read-out of the measured noise component value can be synchronized. Therefore, read-out of the measurement result by the noise measuring circuit can also be controlled by the selection control means, which performs the successive selection of the phase shift circuits.

Because the semiconductor integrated circuit of one embodiment comprises operation start control means for starting an operation of the selection control means when the first specified time elapses to make an operation stable after having powered on, the phase shift circuit minimizing the noise component can be stably selected.

The semiconductor of one embodiment comprises time measuring means for measuring a second specified time after termination of successive selection of the phase shift circuits by the selection control means, and operating the selection control means when the second specified time elapses, wherein successive selection of the phase shift circuits is repeated at intervals of the second specified time. Even when a variance is generated in the phase shift value set after having powered on due to a temperature rise or a change in a power source voltage during the operation period, the noise component generated by the analog circuit can be always minimized.

In one embodiment, the analog circuit is formed as a solid-state image sensing element array, the noise component is a noise component superimposed on a video signal of a shielded region outputted from the solid-state image sensing element array during one horizontal valid period and successive selection of the phase shift circuits by the selection control means is performed in synchronization with the vertical period. Therefore, the phase shift value can be set so that a noise component superimposed on a video signal from the solid-state image sensing element array is minimized.

Therefore, even when variation in transistor characteristics or resistance occurs in semiconductor integrated circuits in the manufacturing stage, a noise component superimposed on a video signal from the solid-state image sensing element array can be minimized after setting of the phase shift value.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit wherein an analog circuit operating in response to a first clock signal and a digital circuit operating in response to a second clock signal having the same period as that of the first clock signal are formed on the same semiconductor substrate; comprising on the semiconductor substrate:

a plurality of phase shift circuits each relatively shifting a phase of one of the first clock signal and the second clock signal from a phase of the other of the first clock signal and the second clock signal by a different value;

a noise measuring circuit for measuring a noise component generated by the analog circuit, wherein the noise component is measured during a manufacturing stage;

selection control means for successively replacing and selecting the plurality of phase shift circuits during the manufacturing stage;

phase shift setting means for obtaining a minimum value out of the noise components measured when each of the phase shift circuits is selected and setting a phase shift value by fixedly selecting only a phase shift circuit selected when the noise component assumes the minimum value;

operation start control means for starting an operation of the selection control means when a first specified time elapses after having powered on; and time measuring means for measuring a second specified time after termination of successive selection of the phase shift circuits by the selection control means, and operating the selection control means when the second specified time elapses, wherein successive selection of the phase shift circuits is repeated at intervals of the second specified time.

2. A semiconductor integrated circuit wherein an analog circuit operating in response to a first clock signal and a digital circuit operating in response to a second clock signal having the same period as that of the first clock signal are formed on the same semiconductor substrate; comprising on the semiconductor substrate:

a plurality of phase shift circuits each relatively shifting a phase of one of the first clock signal and the second clock signal from a phase of the other of the first clock signal and the second clock signal by a different value;

a noise measuring circuit for measuring a noise component generated by the analog circuit, wherein the noise component is measured during a manufacturing stage;

selection control means for successively replacing and selecting the plurality of phase shift circuits during the manufacturing stage; and phase shift setting means for obtaining a minimum value out of the noise components measured when each of the phase shift circuits is selected and setting a phase shift value by fixedly selecting only a phase shift circuit selected when the noise component assumes the minimum value wherein the analog circuit is a solid-state image sensing element array; and the noise component measured by the noise measuring circuit is a noise component superimposed on a video signal of a shielded region outputted from the solid-state image sensing element array during one valid horizontal period; and successive selection of the phase shift circuits by the selection control means is performed in synchronization with a vertical period.

* * * * *